United States Patent [19]

Horst et al.

[11] Patent Number: 4,823,252
[45] Date of Patent: Apr. 18, 1989

[54] OVERLAPPED CONTROL STORE

[75] Inventors: Robert W. Horst, Cupertino; Cirillo L. Costantino, Castro Valley, both of Calif.

[73] Assignee: Tandem Computers Incorporated, Cupertino, Calif.

[21] Appl. No.: 155,427

[22] Filed: Feb. 12, 1988

Related U.S. Application Data

[62] Division of Ser. No. 845,738, Mar. 28, 1986, Pat. No. 4,754,396.

[51] Int. Cl.$^4$ ............................................. G06F 11/20
[52] U.S. Cl. ........................................ 371/8; 365/200; 364/900
[58] Field of Search ... 364/200 MS File, 900 MS File; 365/200; 371/8, 10, 11, 30

[56] References Cited

U.S. PATENT DOCUMENTS

| | | | |
|---|---|---|---|
| 4,546,455 | 10/1985 | Iwahashi et al. | 365/200 |
| 4,656,610 | 4/1987 | Yoshida et al. | 365/200 |
| 4,727,516 | 2/1988 | Yoshida et al. | 365/200 |

OTHER PUBLICATIONS

"Principles of Firmware Engineering in Microprogram Control" Andrews, 1980, pp. 71–79.

*Primary Examiner*—Gary V. Harkcom
*Assistant Examiner*—Randy W. Lacasse
*Attorney, Agent, or Firm*—Townsend & Townsend

[57] ABSTRACT

An interleaved control store having a soft error recovery system. The system includes memory banks storing identical data sets, an error detection unit for indicating that an erroneous data element has been read from a given one of the memory banks, and a correction unit for substituting a corresponding data element read from another memory bank for the erroneous data element read from the given memory bank. Other embodiments include a feedback system for executing a branch and a dynamic, on-line memory element sparing system.

9 Claims, 5 Drawing Sheets

OVERLAPPED CONTROL STORE

This is a division of application Ser. No. 845,738, filed Mar. 28, 1986, now U.S. Pat. No. 4,754,396.

BACKGROUND OF THE INVENTION

1. Field of the Invention

The invention relates generally to digital electronic systems, more particularly, to an architecture for a control store of a Central Processing Unit (CPU).

2. Description of the Relevant Art

Digital system designers are continually attempting to maximize the speed of computer systems and circuits. One particular system of interest is a CPU control store which stores control information in the form of microinstructions. One, or more, microinstructions are executed to implement one machine (macro) instruction.

The memory elements utilized in the control store are characterized by an access time. The magnitude of this access time may restrict the speed of operation of the CPU.

One method of overcoming this speed restriction is to utilize an interleaved memory system. Several slow memory banks are grouped so that every sequential fetch comes from the next memory bank. Thus, the access time for a given instruction overlaps the readout time of the previous instruction.

The various banks of an interleaved memory system may be implemented on a single random access memory (RAM) or on multiple RAMs. Typically, the address (ADR) space of the instruction set is distributed over the memory banks. For example, the nth instruction may be stored at ADR(n) in a given memory bank and the (n+1)th instruction may be stored at ADR(n) in the succeeding memory bank. In this example, one memory bank stores even lines of microcode and the other memory bank stores odd lines of microcode. This distribution of the address space over the memory banks either requires restrictions on the possible branches in the instruction set or reduces the speed of execution of the branches.

Another problem inherent in the use of a control store is the occurrence of soft or hard errors in the instruction set. Generally, upon detecting errors the control store access system must either halt or implement an error correction routine that takes many machine cycles to complete. This error correction function degrades the speed of operation of the CPU.

Accordingly, a control store that allows for fast access to an instruction set is needed in highspeed computer systems. Further, the ability of the control store to quickly correct for hard or soft errors in an instruction is greatly needed.

SUMMARY OF THE INVENTION

The present invention is an electronic memory that utilizes first and second memory banks with each memory bank storing complete copies of a data set. In a preferred embodiment the memory is a control store storing control information in the form of a set of microinstructions for execution as machine instructions by a processor (CPU).

According to one aspect of the invention, an address generator generates a sequence of ADRs for accessing successive instructions in an instruction sequence. An address latch for holding an address is associated with each memory bank. Multiplexers (MUXs) are utilized to direct alternate ADRs in the sequence to the address latch associated with each memory bank during alternate machine cycles. The access time for each memory bank may be longer than the machine cycle because one memory bank is read while the other is enabled onto the bus.

According to a further aspect, a feedback system directs a portion of the control information to the address latch to execute a microbranch. Because complete copies of the control information reside in each memory bank, these branches are unrestricted.

According to a further aspect of the invention, the existence of multiple copies of the instruction set in the control store is utilized to perform a soft error recovery function.

In one embodiment, the instructions read from the control store during a read-out of the instruction set are monitored to detect an erroneous instruction read from a first memory bank. The address of the erroneous instruction is read from the first address latch to the second address latch. The same instruction is then read from the second memory bank. The clock cycle signal to the address generator is temporarily gated to prevent address generation while the instruction is accessed from the second memory bank. After the given instruction is read from the second memory bank the clock signal resumes and the next instruction in the sequence is read from the first memory bank. Thus, the non-erroneous instruction is included in the sequential read-out.

At a later time, the correct instruction is read from the second memory bank and written at the ADR of the first memory bank where the erroneous instruction was stored.

If the correct instruction is written at the given ADR of the first memory bank and the instruction read from the given ADR is still erroneous, then a hard error has occurred and the memory bank is defective.

In one embodiment, the first memory bank is comprised of a group of control store (CS) memory elements, for storing the instruction set for the CPU, and a spare memory element. The output of the first ADR latch is provided to each memory element. The data read from the one of the memory elements comprises a subset of the bits of an instruction. In the case of a hard error, usually only one of the memory elements is defective. The outputs of the CS memory elements and the spare memory element are coupled to the input ports of a signal directing unit.

According to a further aspect of the invention, upon detection of a hard error in the output of the first control store, the signal directing circuitry is utilized for substituting the output of the spare memory element for the output of the defective memory element to dynamically reconfigure the first memory bank. The data required for the spare memory element is read from the second memory bank.

This RAM sparing function is performed on-line thereby obviating the need to interrupt the system to correct hard errors. Other advantages and features of the invention will be apparent in view of the drawings and following detailed description.

DETAILED DESCRIPTION OF THE PREFERRED EMBODIMENTS

The present invention is an interleaved control store that provides high speed access to an instruction set and includes a soft error recovery system and a RAM sparing system for correcting hard errors.

Figure 1:
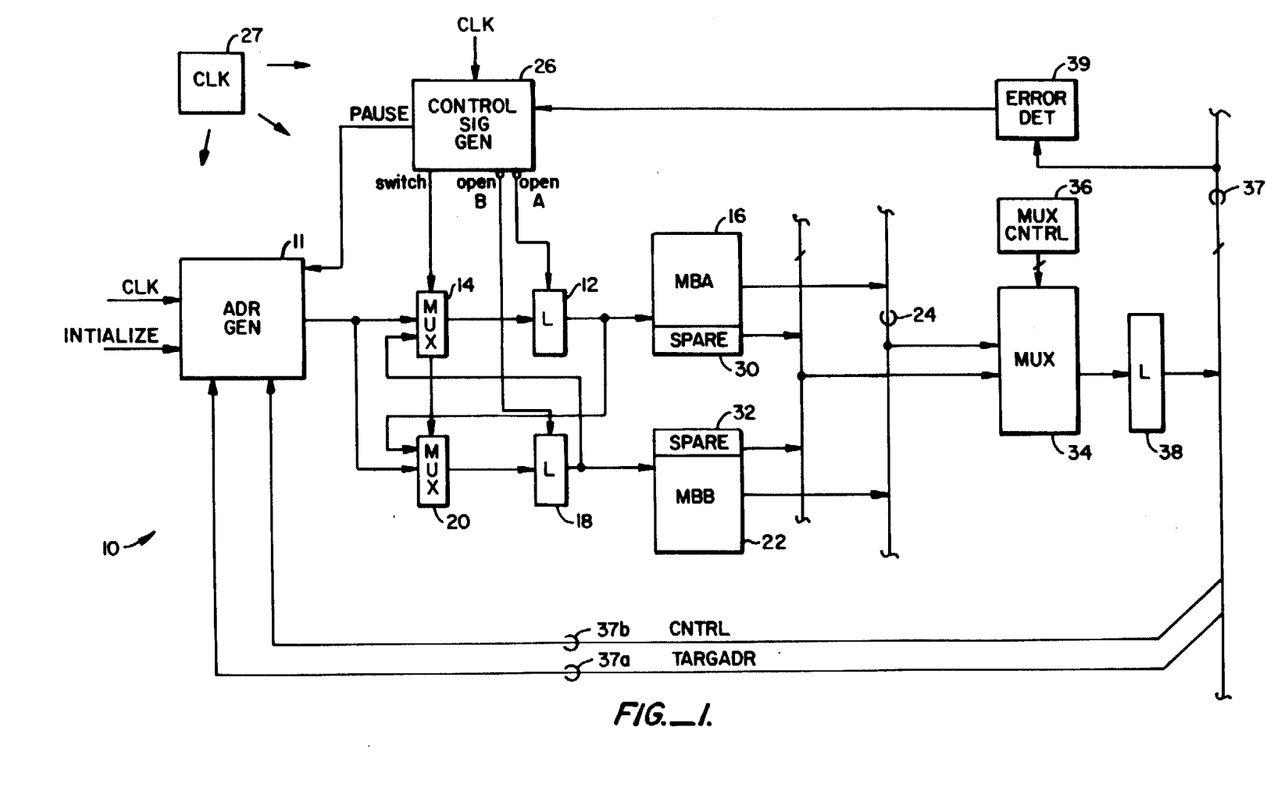
FIG. 1 is a block diagram of an embodiment of the present invention.

Referring to FIG. 1, the interleaved control store 10 includes an address generating circuit 11 having a clock input, an initialization input, and an output port. A first address storage unit 12 has a first address input port coupled to a first signal directing (SD) output port of a signal directing unit 14. The first storage unit 12 has a first address output port coupled to the address port of a first memory bank 16.

Similarly, a second address storage unit 18 has a first address input port coupled to the SD output port of a second signal directing unit 20 and has a second address output port coupled to the address port of a second memory bank 22. Each signal directing unit 14 and 20 has two input ports and one output port. A first input port of the first signal directing unit 14 is coupled to the output port of the address generator 11 and the second input port is coupled to the output port of the second address storage unit 18. Similarly, a first input port of the second signal directing unit 20 is coupled to the output port of the address generator 11 and the second input port is coupled to the output port of the first address storage unit 12. Each of the signal directing units 14 and 20 includes a control input for receiving a control signal.

The output ports of the first and second memory banks 16 and 22 are coupled to a first data bus 24. A control signal generator 26 includes a pause output port, a switch output port, and first and second open signal output ports. The pause output port of the control signal generator 26 is coupled to a pause input port of the address generator 11; the switch output port of the control signal generator 26 is coupled to the control input ports of the first and second signal directing units 14 and 20; and the first and second open signal output ports are coupled to first and second address storage units 12 and 18. The control signal generator 26 also includes CLK and error signal input ports. The CLK signals are generated by a system clock 27.

First and second spare memory elements 30 and 32 are associated with the first and second memory banks 16 and 22, respectively. The output ports of the first and second spare memory elements 30 and 32 and the first data bus 24 are coupled to an output multiplexer 34. The output multiplexer 34 has a control input coupled to the output port of a multiplexer control unit 36 and an output port coupled to a second data bus 37 via an output latch 38. As indicated, the second data bus 37 includes N lines. A subset of these lines forms the TARGADR and CNTRL feedback buses 37a and 37b. These feedback buses 37a and 37b are coupled to TARGADR and CNTRL input ports of the ADR generator. The remaining lines of second data bus 37 is sent to the rest of the CPU to provide control information.

An error detecting unit 39 has an input port coupled to the second data bus 37 and an output port coupled to the error signal input port of the control signal generator 26.

An overview of the operation of the system will now be described with respect to FIG. 1. The first and second memory banks 16 and 22 store control information for the CPU. The address generating circuit 10 is initialized by a signal on at the initialization input. Typically, the initial address will be supplied by a macroinstruction received from an instruction cache. The address generator 11 then generates a sequence of addresses with a new address in the sequence generated at each clock cycle. This sequence of addresses is utilized to implement a sequential read-out of all, or part of, the instruction set. The control signal generator 26 generates latch open pulses at each clock signal. The first and second latch open pulses are generated on alternating clock cycles so that addresses generated on even clock cycles are latched into the first address storage unit 12 and addresses generated on odd clock cycles are latched into the second address storage unit 18.

The first and second memory banks operate in a pipelined manner and, after an initial set-up time, an instruction from one of the memory banks is valid on the first data bus 24 while the subsequent instruction is being accessed in the other memory bank.

Fast microbranches are supported because a complete copy of the control information is stored in each memory bank.

Each memory bank is characterized by an access time defined as the delay between the generation of an address at the address generating unit 10 and the time that valid data from the address storage location in the memory bank is present on the first data bus 24. As is well known in the art, a RAM unit is characterized by an internal access time being the interval between the time that an address is received at the address port of the RAM and the time that the contents of the addressed location are valid at the RAM output port. In addition to this internal access time, the total access time includes the delays introduced by the signal directing units 14 and 20 and the address storage units 12 and 18. The interleaved structure of the present system facilitates the use of a system clock having a clock cycle shorter than the duration of the total access time for the memory banks.

The architecture of FIG. 1 also includes a soft error recovery system. As described above, each memory bank 16 and 22 includes a complete copy of an instruction set. A given instruction is located at the same address in each of the memory banks. The error detection unit 39 monitors the output of both memory banks 16 and 22. If, during a sequential read-out, an error is detected in the instruction read from a given memory bank for a given address then the instruction in the other memory bank is substituted for the erroneous instruction. The system also performs a RAM sparing hard error correction function. If a memory element in one of the memory banks 16 or 22 is found to be defective, then the memory bank is dynamically reconfigured to replace the defective memory element with the spare memory element. The soft error recovery system is utilized to correct erroneous data in latch 38, from the non-defective memory bank.

Figure 2:
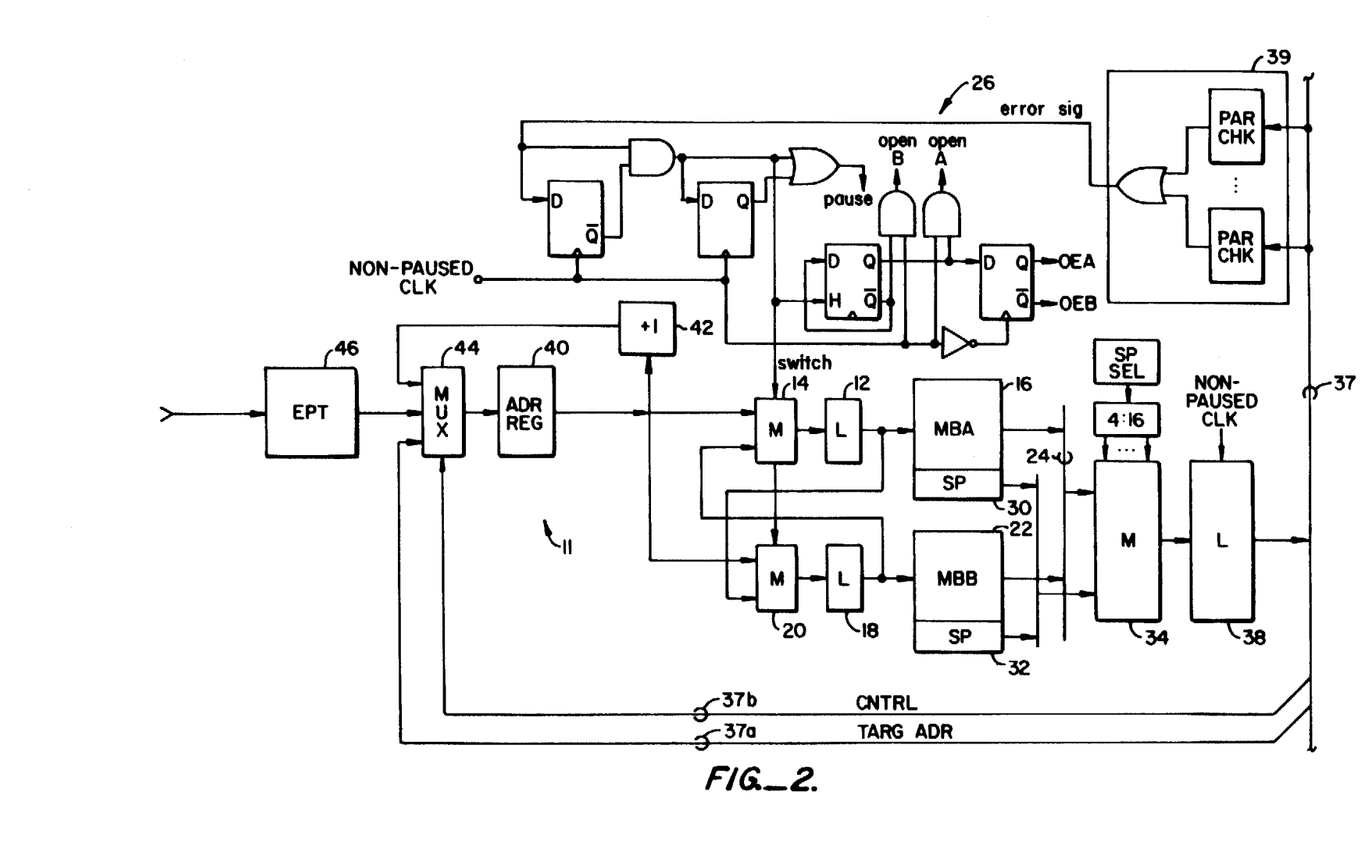
FIG. 2 is a circuit diagram corresponding to the block diagram of FIG. 1.

FIG. 2 is a circuit diagram corresponding to the block diagram of FIG. 1. Referring now to FIG. 2, the address generating unit 11 includes an address register 40 having an output port coupled to the address input ports of first and second multiplexers 14 and 20. Also coupled to the output port of the address register 40 is an incrementer 42. A branch multiplexer 44 includes input ports coupled to the output port of the incrementer 40 the output port of an entry point table 46, and the TARGADR bus 37a. The branch MUX 44 also includes a control input coupled to CNTRL bus 37b.

The error detection unit 39 includes parity checking circuitry to monitor the parity of the instructions on the second data bus 37.

The control signal generator 26 includes flip-flops and gates coupled to generate the first and second open signals, a switch signal, and first and second output enable signals. The output ports of the first and second memory banks 16 and 22 are coupled to the first data bus 24 by tri-state buffers. These buffers are enabled by the output enable signals generated by the control signal generator unit 26.

The operation of the circuit depicted in FIG. 2, during a sequential read-out of the instruction set, will now be described with reference to FIG. 2 and the timing diagram of FIG. 3A. A clock cycle is defined as the period between two rising edges of clock pulses 60. During the first clock cycle, the MUX 44 couples the entry point table 46 output port to the input port of the ADR register 40. Accordingly, the CSPC 40 is initialized and the output of the ADR register 40 during the first clock cycle is the first address (ADR(1)). Subsequent to this first clock cycle, the MUX 44 couples the output of the incrementer 42 to the input port of the ADR register 40. Thus, during subsequent clock cycles the address is incremented by one. The output of the ADR register 40 is depicted as a series of addresses on line 62 of FIG. 3A.

The open pulses 64 for the first address latch 12 are generated during the first half of odd clock cycles and the open pulses 64 for the second address latch 18 are generated during the first half of even address cycles.

Referring now to the first open signal 64, the leading edges of the successive open pulses are separated by two clock cycles.

The region of the signal between the two open pulses 64a defines a stable period in the latch cycle. For example, during the first and second clock cycles, the first latch 12 is transparent when the first open pulse 64a is received at the first latch 12. Accordingly, ADR(1) is transmitted from the address input port to the address output port of the first latch 12. At the falling edge of the open pulse 64a, ADR(1) is latched and the value of the signal at the output port is equal to ADR(1) during the stable period of the latch cycle. Thus, ADR(1) is presented to the address input port of the first memory bank 16 for the first and second clock cycles. Similarly, the signal at the address input port of the first memory bank 16 is equal to ADR(3) for the third and fourth clock cycles, ADR(5) for the fifth and sixth clock cycles, and so on.

Referring now to the second open signal 64b, the second address latch 18 is controlled so that the signal received at the address input port of the second memory bank 22 is equal to ADR(2) for the second and third clock cycles, ADR(4) for the fourth and fifth clock cycles, and so on.

The first and second output enable signals 66A and 66B are active when low. Referring to the first output enable signal 66A, the signal becomes active at the falling edge of the first open pulse and remains active for one cycle. The first and second output enable signals are complementary signals.

The access and data valid cycles are depicted by lines 68 and 70. Location ADR(1) of the first memory bank 16 is accessed during the first clock cycle. During the second clock cycle, the ADR(1) data from the first memory bank 16 is valid on the first data bus 24. Additionally, during the second clock cycle, the location ADR(2) is being accessed in the second memory bank 22. During the third clock cycle the ADR(2) data from the second memory bank is valid on the first data bus 24 and the ADR(3) location of the first memory bank 16 is being accessed.

The advantage of the interleaved memory system is now apparent. By simultaneously accessing data in one memory bank while valid data from the other memory bank is driven onto the bus 24 a clock cycle of shorter duration than the memory access time may be utilized for the CPU. Accordingly, inexpensive, slow memory elements may be utilized while maintaining a high overall system clock rate.

The architecture of the present system obviates the microbranch complications of interleaved control stores.

Figure 3A:
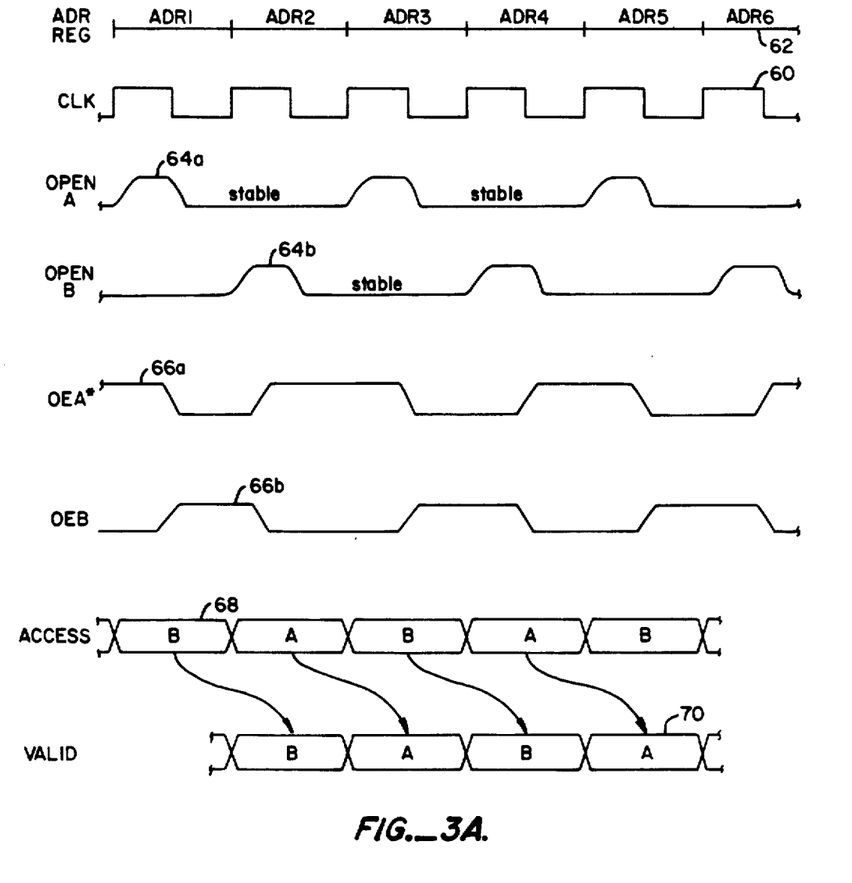
FIG. 3A is a timing diagram illustrating the operation of the embodiment depicted in FIG. 2.
Figure 3B:
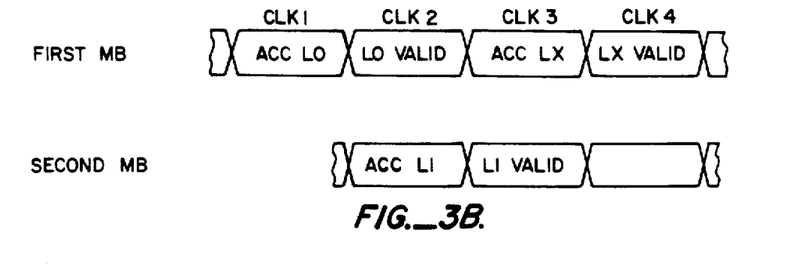
FIG. 3B is a timing diagram illustrating a microbranch.

FIG. 3B is a timing diagram illustrating a microbranch routine. The following is an example of a microbranch routine:

```
LO:   GO TO TARGADR (LX)
L1:
 .
 .
 .
LX:
```

Referring now to FIGS. 2 and 3B, during clock cycle 1 the L0 ADR is latched into the first address storage unit 12 and L0 is accessed from the first memory bank 16.

During clock cycle 2, the L1 ADR is latched into the second address storage unit 18, L1 is accessed from the second memory bank, and L0 is valid on the second bus 37. In this example, L0 includes control and address information for a branch to instruction LX. The control information is supplied to the control input of the branch MUX 44 via the CNTRL bus 37b. This control information causes the branch MUX 44 to direct the information on the TARGADR bus 37a to the ADR register 40. Accordingly, during clock cycle 2, the LX address is latched into the address register 40.

During clock cycle 3, the LX address is loaded into the first address storage unit 12 and LX is accessed from the first memory bank 16. L1 is valid on the bus 37.

During clock cycle 4, LX is valid on the bus 37. The advantage of the present system over an even/odd interleaved system is now apparent. At clock cycle 2, the present system is able to access LX because a complete copy of the control information is stored in each memory bank. In an even/odd system, assume that L0 is accessed from the even (first) memory bank and that the line LX is in the odd (second) memory bank. At clock cycle 2, LX could not be accessed because the second memory bank is not in an access cycle. Accordingly, complicated control procedures must be implemented for facilitating branches.

The soft error recovery and retry feature of the system will now be described with reference with FIG. 2 and the timing diagram of FIG. 4. A soft error is an error in the data read from a RAM that is not due to a defect in the RAM circuitry itself. For example, an alpha particle may release charge which is captured in a given memory cell, thereby changing a "0" to a "1". The data read from this cell will be in error but the cell itself is not defective.

Figure 4:
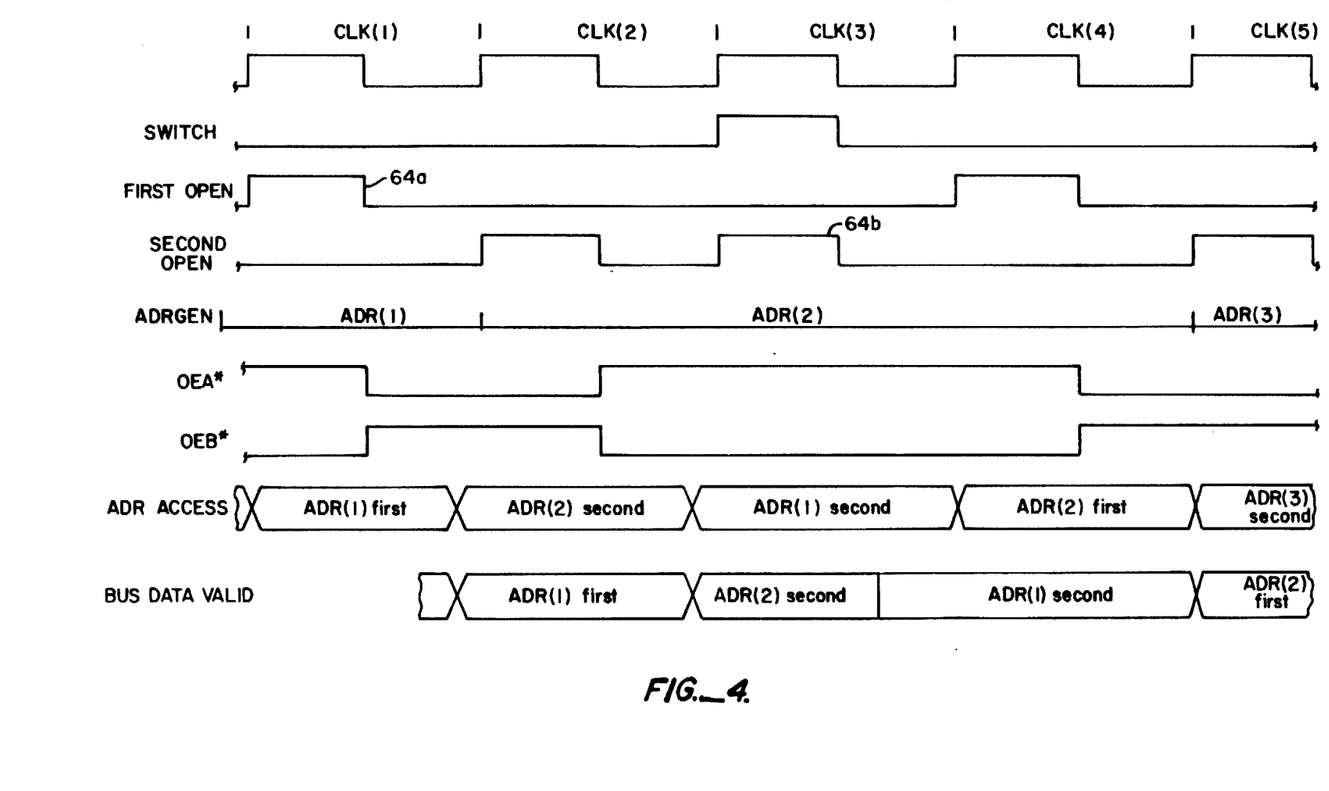
FIG. 4 is a timing diagram illustrating the operation of the circuit depicted in FIG. 2 during a soft error recovery mode.

Referring to FIG. 4, during clock cycle 1, ADR(1) is generated by the ADR register 40 and the first open pulse 64a is generated by the control signal generator 26. Accordingly, the first address is latched into the first address latch 12. As described above, during clock cycle 2 the data from the ADR(1) location of the first memory bank 16 will be valid on the bus 24, the second address in the sequence, ADR(2) will be generated by the ADR register 40, and a second open pulse 64B will be generated by the control signal generating unit 26. Thus, during clock cycle 2 the second address is latched into the second address latch 18 and the ADR(1) data is valid on the bus 24. This data is latched into latch 38.

If the ADR(1) data from the first RAM memory bank indicates a parity error, then this error will be detected by the error detection unit 39 during the second clock cycle. The error detection unit 39 generates an error indication which causes the control signal generator 26 to generate a pause signal to freeze the output of the address generator 11 at the second address, ADR(2), of the sequence. The logic circuitry in the control signal generating unit 26 reacts to the error indication to generate a second open pulse 64B during the third clock cycle and to suppress the generation of the first open pulse 64A during the third clock cycle. Note that this is a reverse in phase from the ordinary sequence of open pulses, as illustrated in FIG. 3A.

During clock cycle 3, the switch signal to the multiplexers 14 and 20 is asserted by the control signal generating circuitry 26 so that the output of the first address latch 12 is coupled to the input of the second address latch 18. Accordingly, since the first address is still latched in the first address latch 12, the first address is latched into the second address latch at clock cycle 3. During clock cycle 3, the ADR(1) location in the second memory bank is accessed and, at clock cycle 4, the contents of the first address and the second memory bank are valid on the first bus 24. Thus, the erroneous data from the first memory bank 16, stored in latch 38, is corrected.

Additionally, during clock cycle 4, the control signal generating unit 26 generates a first open pulse 64A to latch ADR(2) into the first address latch 12. Accordingly, the ADR(2) location in the first memory bank 16 is accessed during clock cycle 4 and ADR(2) data is valid on the bus during clock cycle 5. At clock cycle 5, the control signal generating unit 26 gates the pause signal and the ADR register 40 generates ADR(3) in the sequence of addresses. The second open pulse 64B is generated during clock cycle 5 and ADR(3) is latched into the second address latch 18.

Comparing the timing diagrams of FIG. 3A and FIG. 4, it is seen that during normal operation the ADR(3) data would be accessed during the third clock cycle and that during the soft error recovery mode ADR(3) data is accessed during the fifth clock cycle. Accordingly, the fetching of the instruction set is delayed by two clock cycles when a soft error is detected.

This short delay is insignificant and the soft error recovery function is essentially transparent. Thus, the CPU is able to operate efficiently in an environment where soft errors are likely to occur.

During a revive cycle, the data stored at ADR(1) of the second memory bank 22 is written into ADR(1) of first memory bank 16 during a pause in the instruction set fetch routine. The contents of ADR(1) of the first memory bank are then read and retried for error detection. In the case of a soft error, no error will be detected because the first memory bank itself is not defective.

If a large number of errors is detected for a given memory bank, or, if the revived data is still erroneous, then a hard error has been detected and the given memory bank is defective.

A RAM sparing system for dynamically reconfiguring a defective control store to compensate for detected hard errors will now be described with reference to FIG. 5.

Figure 5:
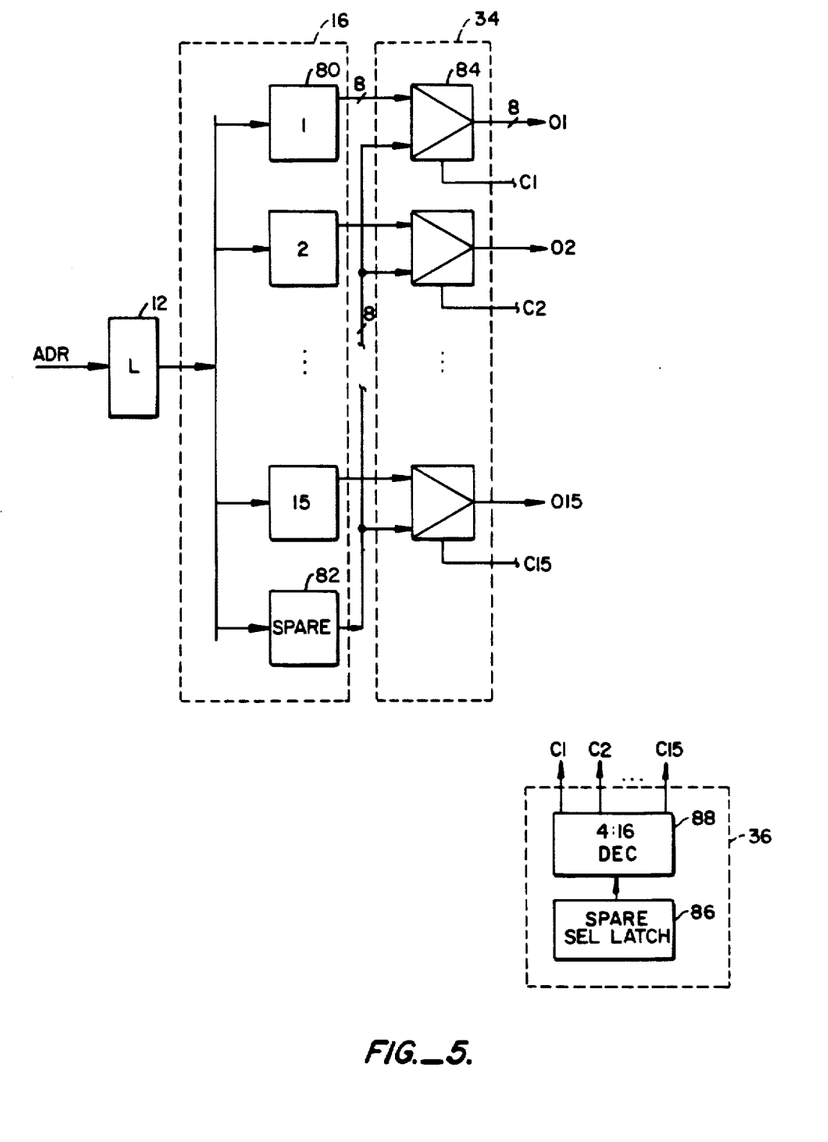
FIG. 5 is a circuit diagram of an embodiment of a memory bank.

FIG. 5 is a detailed schematic diagram depicting the architecture of the control store 16, the output MUX 34, and the output MUX control unit 36. In FIG. 5, the memory bank 16 includes fifteen CS memory elements 80 and a spare memory element 82. The output MUX 34 includes fifteen 2:1 MUXs with each 2:1 MUX having a first input port coupled to the output port of one of the CS memory elements 80. The second input port of each 2:1 MUX 84 is coupled to the output port the spare memory element 82. Each of the 2:1 multiplexers 34 has a control input for receiving a control signal.

The output multiplexer control unit 36 includes a spare select latch 86 and a 4:16 decoder 88. The output port of the spare select latch 86 is coupled to the input port of the 4:16 decoder 88. The decoder 88 has fifteen output ports with each output port coupled to the input port of one of the 2:1 MUXs 84.

In one embodiment, each instruction in the instruction set is a 120 bit word with 8-bit subgroups of the word supplied by the fifteen memory elements 80. Generally, a parity error in the instruction will be due to the erroneous output of one of the CS memory elements 80 in the memory bank 16. If no hard error is present, then the control signals received at the fifteen 2:1 MUXs couple the first input port of the MUX to the MUX output port.

If a hard error is detected then the defective memory element 80 is identified utilizing standard diagnostic techniques. When the defective memory element 80, e.g., the second memory element, is identified then the identity of the defective memory element is loaded into the spare select latch 86. The decoder then generates a control signal at the second output port of the decoder 88 to couple the second input port of the second 2:1 MUX 34 to the output port of the MUX. The remaining 2:1 MUXs 34 still couple the first input port to the MUX output port. Accordingly, the output of the spare RAM 82 has been substituted for the output of the second memory element 80.

During a pause in the instruction fetch routine, the contents of the second memory bank are written into the memory elements of the first memory bank. However, the contents of the second CS memory element in second memory bank 22 are written into the spare memory element 82. Thus, the first memory bank 16 has been reconfigured to compensate for the defective memory element.

Unlike existing sparing techniques, this reconfiguring of the memory bank is done on-line to reduce system down time.

The invention has now been described with reference to specific embodiments. Various modifications and substitutions will be apparent to persons skilled in the relevant arts. For example, the system is designed for use with an arbitrary number of memory banks. Additionally, the data stored in the memory banks need not be an instruction set but may be an arbitrary data set. Further, in the above-described embodiments the same instructions are stored identical addresses in both memory banks. however, the same instructions may be stored at non-identical addresses providing a system for defining the relationship between corresponding addresses is provided. Such a correspondence is established utilizing standard technology. Accordingly, it is not intended that the invention be limited except as provided by the appended claims.

What is claimed is:

1. In a memory system of the type having first and second memory banks for storing copies of a set of data elements, with each memory bank having a set of control store (CS) memory elements for storing a subset of the bits comprising the data elements and having a spare memory element, a system for recovering from soft errors and for dynamically reconfiguring the first memory bank to compensate for a defective CS memory element comprising:

means for monitoring data, read from a given storage location in the first memory bank, to detect errors in said data whenever data is read from said given storage location;

means for substituting correct data stored in said second memory bank for erroneous data read from the given storage location of the first memory bank whenever an error is detected;

means for identifying a defective CS memory element in the first memory bank;

means for writing the correct data stored in the second memory bank, corresponding to the data stored in said defective CS memory element, into the spare memory element of the first memory bank; and means for substituting the output of the spare memory element in the first memory bank for the output of the defective memory element.

2. In a memory system of the type having first and second memory banks for storing copies of a set of data elements, a system for recovering from soft errors comprising:

means for monitoring data, read from a given storage location in the first memory bank, to detect errors in said data whenever data is read from said given storage location; and means for substituting correct data stored in said second memory bank for erroneous data read from the given storage location of the first memory bank whenever an error is detected.

3. In a memory system of the type having first and second memory banks for storing copies of a set of data elements, with each memory bank having a set of CS memory elements for storing a subset of the bits comprising the data elements and having a spare memory element, a system for dynamically reconfiguring the first memory bank to compensate for a defective CS memory element comprising:

means for identifying a defective CS memory element in the first memory bank;

means for writing the data stored in the second memory bank, corresponding to the data stored in said defective CS memory element, into the spare memory element of the first memory bank; and means for substituting the output of the spare memory element in the first memory bank for the output of the defective memory element.

4. An improved interleaved memory system operating at a system clock rate comprising:

first and second memory banks, each having an ADR port for receiving ADRs, with each memory bank storing a copy of an identical data set with corresponding data elements stored at the same ADR in each memory element;

means for generating a series of ADRs at the system clock rate and for directing said ADRs to an ADR-GEN output port;

first storage means for storing an ADR received at a first ADR input port upon receipt of a first open signal and for directing said stored ADR to a first ADR output port with said first ADR output port coupled to the ADR port of said first memory bank;

second storage means for storing an ADR received at a second ADR input port upon receipt of a second open signal and for directing said stored ADR to a second ADR output port with said second ADR input port coupled to said ADRGEN output port and said second ADR output port coupled to the ADR port of said second memory bank;

signal directing means, having first and second SDM input ports coupled to the ADRGEN output port and first ADR output port, respectively, having an SDM output port coupled to said second ADR input port and having an SDM control signal input port for receiving an SDM control signal, said SDM for coupling said first SDM input port to said SDM output port when said SDM control signal is in a first state and for coupling said second SDM input port to said SDM output port when said first SDM control signal is in a second state;

sequential signal generating means, having an error indication port, for generating said first and second open signals on alternating clock cycles when no error indication is received;

means for detecting an error in a data element read from a given ADR in the first memory bank and for generating an error indication when the error is detected at a given clock cycle; and means, adapted to receive said error indication, for delaying the generation of the first open signal for a recovery time interval, being a selected number of clock cycles after the given clock cycle, to store the given ADR in said first ADR storage means during said recovery time interval, for setting the state of said SDM control signal to the second state during the recovery time interval to couple the first ADR output port to the second ADR input port, and for generating a second open signal during the recovery time interval to store the given ADR in said second ADR storage means so that the data element stored at the given ADR in said said memory bank is accessed.

5. An improved interleaved memory system operating at a system clock rate comprising:

first and second memory banks, each having first and second ADR ports, respectively, for receiving ADRs, with each memory bank storing a copy of an identical data set with corresponding data elements stored at the same ADR in each memory element;

with said first and second memory banks each including a set of CS memory elements having ADR ports coupled to said first ADR output port, with corresponding CS memory element in each memory bank for providing selected bits of the data elements stored in said memory bank;

a spare memory element in said first memory bank;

means for controllably substituting the output of said spare memory element for the output of a selected memory element of said first memory bank; and means for writing the data stored in the memory element of the second memory bank, that corresponds to said selected memory element of said first memory bank, into said spare memory element.

6. A method of generating CPU control instructions and for compensating for soft errors comprising the steps of:

providing first and second control store copies having output ports coupled to a bus;

accessing said first control store to obtain first control information;

accessing said second control store to obtain second control information;

simultaneously driving said first control information onto said bus while said second control information is being accessed;

detecting an error in said first control information; and accessing first control information from said second control store subsequent to detecting said error.

7. A method of generating CPU control instructions and for executing a branch comprising the steps of:

providing first and second control store copies having output ports coupled to a bus;

accessing said first control store to obtain first control information;

accessing said second control store to obtain second control information;

simultaneously driving said first control information onto said bus while said second control information is being accessed; and utilizing a portion of said first control information for accessing said first control store to execute a branch.

8. In a memory system of the type having first and second memory banks for storing copies of a set of data elements, a system for recovering from soft errors comprising;

means for monitoring data, read from a given storage location in the first memory bank, to detect errors in said data whenever data is read from said given storage location;

means for reading data in the second memory bank which is the copy of the data of the first memory bank; and means for writing to the given memory location of the first memory bank the data copy from the second memory bank whenever an error is detected so that the error detected in the first memory bank is corrected.

9. In a memory system of the type having first and second memory banks for storing copies of a set of data with each memory bank having a set of CS memory elements for storing a subset of the bits comprising the data elements and having a spare memory, a system for dynamically reconfiguring the first memory bank to compensate for a defective CS memory element comprising:

means for monitoring data, read from a given storage location in the first memory bank, to detect errors in said data whenever data is read from said given storage location;

means for identifying a defective CS memory element in the first memory bank;

means for writing the data copy stored in the second memory bank, corresponding to the data stored in said defective CS memory element, into the spare memory of the first memory bank; and means for substituting the output of the spare memory in the first memory bank for the output of the defective CS memory element in the first memory bank.

* * * * *